United States Patent
Hwang

(10) Patent No.: US 9,379,354 B2
(45) Date of Patent: Jun. 28, 2016

(54) DISPLAY DEVICES AND METHODS OF MANUFACTURING DISPLAY DEVICES

(71) Applicant: SAMSUNG DISPLAY CO., LTD., Yongin, Gyeonggi-Do (KR)

(72) Inventor: Hyun-Min Hwang, Cheonan-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/532,180

(22) Filed: Nov. 4, 2014

(65) Prior Publication Data

US 2015/0333290 A1 Nov. 19, 2015

(30) Foreign Application Priority Data

May 19, 2014 (KR) .................. 10-2014-0059687

(51) Int. Cl.
| | | |
|---|---|---|
| *H01L 21/00* | (2006.01) | |
| *H01L 27/00* | (2006.01) | |
| *H01L 51/52* | (2006.01) | |
| *H01L 51/56* | (2006.01) | |
| *H01L 27/32* | (2006.01) | |

(52) U.S. Cl.
CPC ........ *H01L 51/5246* (2013.01); *H01L 27/3225* (2013.01); *H01L 51/56* (2013.01); *H01L 2227/323* (2013.01); *H01L 2251/558* (2013.01)

(58) Field of Classification Search
CPC ..... H01L 51/5246; H01L 51/56; H01L 51/52; H01L 27/3225; H01L 27/124; H01L 27/1248; H01L 2227/323; H01L 2251/558
See application file for complete search history.

(56) References Cited

U.S. PATENT DOCUMENTS

| | | | | |
|---|---|---|---|---|
| 8,395,319 | B2 * | 3/2013 | Tchakarov | .......... H01L 51/5203 313/504 |
| 8,581,294 | B2 | 11/2013 | Lee et al. | |
| 2009/0218925 | A1 | 9/2009 | Kwak | |
| 2009/0302760 | A1 * | 12/2009 | Tchakarov | .......... H01L 51/5203 313/512 |
| 2012/0235557 | A1 | 9/2012 | Lee | |
| 2014/0061612 | A1 * | 3/2014 | Yamazaki | ........... H01L 51/5243 257/40 |

FOREIGN PATENT DOCUMENTS

| | | |
|---|---|---|
| JP | 2003-317934 A | 11/2003 |
| KR | 10-0730225 B1 | 6/2007 |
| KR | 10-0897157 B1 | 5/2009 |
| KR | 10-2012-0007355 A | 1/2012 |
| KR | 10-2012-0105252 A | 9/2012 |

* cited by examiner

*Primary Examiner* — Nikolay Yushin
(74) *Attorney, Agent, or Firm* — Lee & Morse, P.C.

(57) ABSTRACT

A display device includes a display panel having a first substrate having a display region and a peripheral region surrounding the display region, a light emitting structure in the display region, a sealant in the peripheral region, the sealant including a first portion having a first width, and a second portion adjacent to the first portion and having a second width smaller than the first width, and a second substrate on the light emitting structure and the sealant, a body including an upper frame and a lower frame, the body receiving the display panel, and at least one function button at a first portion of the display device, at least a portion of the function button protruding out of the body, and the first portion of the sealant being disposed adjacent to the at least one the function button at the first portion of the display device.

21 Claims, 10 Drawing Sheets

DISPLAY DEVICES AND METHODS OF MANUFACTURING DISPLAY DEVICES

CROSS REFERENCE TO RELATED APPLICATION

Korean patent Application No. 10-2014-0059687, filed on May 19, 2014, in the Korean Intellectual Property Office, and entitled: "Display Devices and Methods of Manufacturing Display Devices," is incorporated by reference herein in its entirety.

BACKGROUND

1. Field

Example embodiments relate to display devices and methods of manufacturing display devices. More particularly, example embodiments relate to display devices including sealants having enlarged portions adjacent to function buttons of the display devices and methods of manufacturing the display devices.

2. Description of the Related Art

Electric devices including a display panel may include function buttons, e.g., at least one key button acquiring an input of a user, for a convenience of the user. Generally, the function buttons may have shapes protruding out of the electric devices. The electric devices may receive various commands, e.g., initiation of an operation, termination of an operation, and volume control etc., from the user through the function buttons.

SUMMARY

According to one aspect of example embodiments, there is provided a display device including a display panel having a first substrate having a display region and a peripheral region surrounding the display region, a light emitting structure in the display region, a sealant in the peripheral region, the sealant including a first portion having a first width, and a second portion adjacent to the first portion and having a second width smaller than the first width, and a second substrate on the light emitting structure and the sealant, a body including an upper frame and a lower frame, the body receiving the display panel, and at least one function button at a first portion of the display device, at least a portion of the function button protruding out of the body, and the first portion of the sealant being disposed adjacent to the at least one the function button at the first portion of the display device.

In example embodiments, two opposite sides of the first portion of the sealant may be stretched away from each relative to respective opposite sides of the adjacent second portion. For example, the first portion of the sealant may have a substantially elliptical plan shape, a substantially track plan shape, a substantially rectangular shape, etc. Additionally, the second portion of the sealant may have a substantially line shape, a substantially bar shape, etc.

In some example embodiments, only one side of the first portion of the sealant may be stretched away to define the first width relative to respective opposite sides of the adjacent second portion. For example, the first portion of the sealant may have a substantially semicircular plan shape, a substantially arch plan shape, etc. Additionally, the second portion of the sealant may have a substantially line shape, a substantially bar shape, etc.

In example embodiments, the display device may additionally include a sealing member disposed between at least one the function button and the display panel. Further, the display device may additionally include a window disposed on the display panel.

In example embodiments, the sealant may have a substantially maximum width at a center of the first portion of the sealant.

According to another aspect of example embodiments, there is provided a method of manufacturing a display device. In the method, a display panel may be formed. The display panel may include a first substrate having a display region and a peripheral region, a light emitting structure formed in the display region, a sealant formed in the peripheral region, and a second substrate formed the light emitting structure and the sealant may be provided. A body including an upper frame and a lower frame may be formed to receive the display panel. At least one function button at least partially protruding out of the body may be formed. The at least one the function button may be formed at a first portion of the display device. The sealant may include a first portion having a relatively large width and a second portion having a relatively small width. The first portion may be positioned adjacent to the at least one the function button at the first portion of the display device. The second portion may be positioned adjacent to the first portion of the sealant.

In example embodiments, the sealant may be formed such that both sides of the first portion of the sealant may be enlarged. For example, the first portion of the sealant may have a substantially elliptical plan shape, a substantially track plan shape, a substantially rectangular shape, etc. The second portion of the sealant may have a substantially line shape, a substantially bar shape, etc. Alternatively, the sealant may be formed such that one side of the first portion of the sealant may be enlarged. For example embodiments, the first portion of the sealant may have a substantially semicircular plan shape, a substantially arch plan shape, etc. The second portion of the sealant may have a substantially line shape, a substantially bar shape, etc. Further, the sealant may have a substantially maximum width at a center of the first portion of the sealant.

In example embodiments, a sealing member may be additionally formed between the at least one the function button and the display panel. Further, a window may be additionally formed on the display panel.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
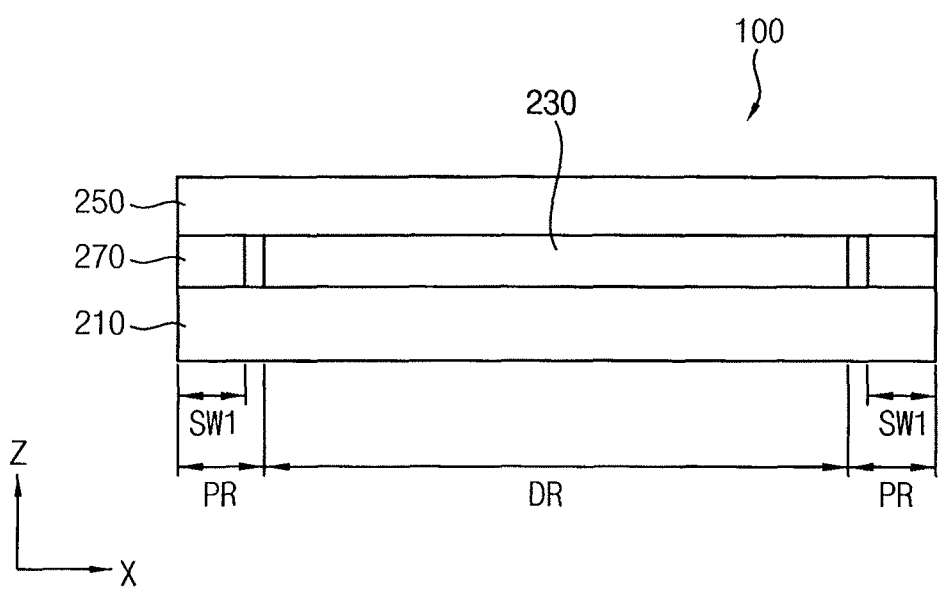
FIG. 1 illustrates a cross-sectional view of a display panel of a display device in accordance with example embodiments.

Example embodiments will now be described more fully hereinafter with reference to the accompanying drawings; however, they may be embodied in different forms and should not be construed as limited to those set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
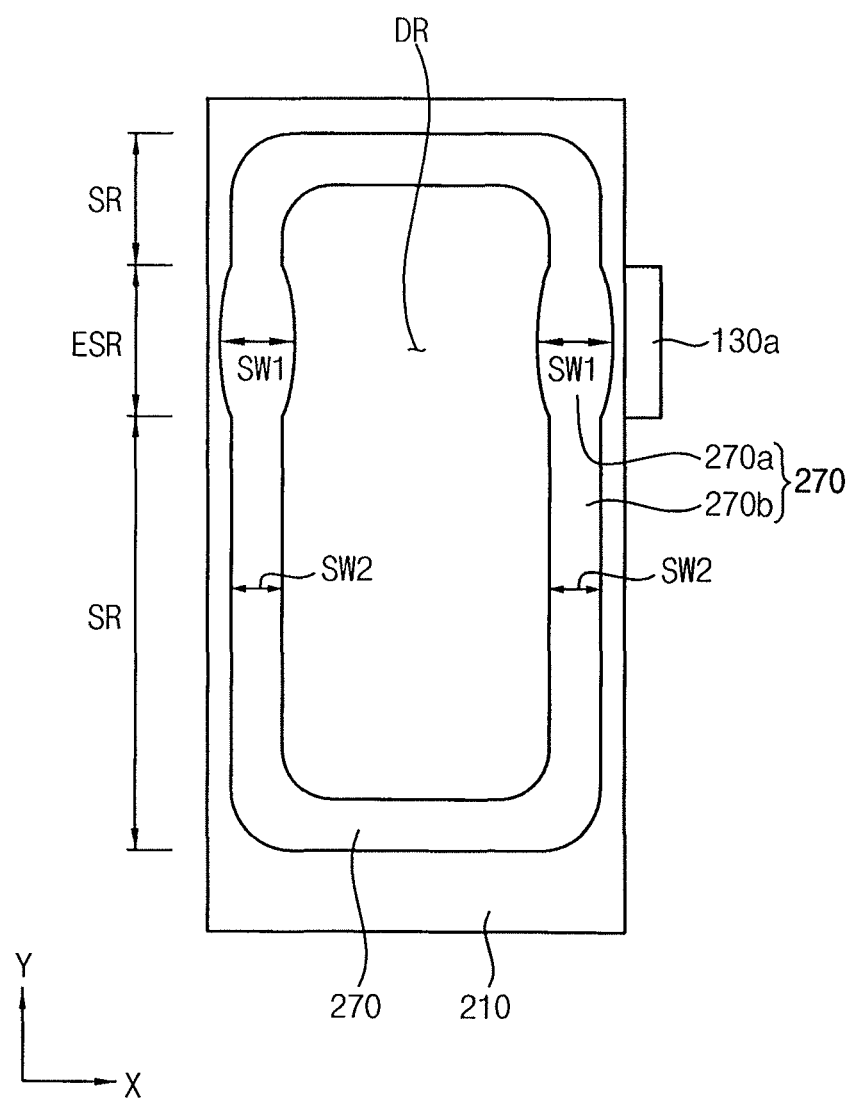
FIG. 2 illustrates a plan view of a sealant of the display panel in FIG. 1.

FIG. 1 is a cross-sectional view of a display panel of a display device in accordance with example embodiments. FIG. 2 is a plan view of a sealant of the display panel in FIG. 1, and FIG. 3 is an enlarged plan view of the sealant in FIG. 2.

Figure 3:
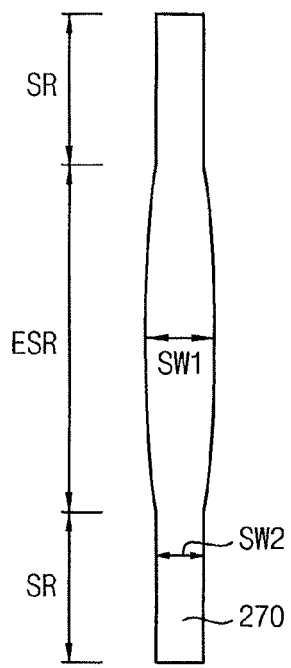
FIG. 3 illustrates an enlarged plan view of the sealant in FIG. 2 in accordance with example embodiments.

Referring to FIGS. 1 to 3, a display panel 100 according to example embodiments may include a first substrate 210, a light emitting structure 230, a second substrate 250, a sealant 270, etc. In example embodiments, the light emitting structure 230 may include a switching element, an anode, a light emitting layer, a cathode, etc.

The first substrate 210 may have a display region DR and a peripheral region PR. The first substrate 210 may include a transparent inorganic material or flexible plastic. For example, the first substrate 210 may include a glass substrate, a quartz substrate, etc. In another example, the first substrate 210 may include a flexible transparent resin substrate, e.g., a polyimide substrate. For example, the polyimide substrate may include a first polyimide layer, a barrier film layer, a second polyimide layer, etc.

In some example embodiments, the first substrate 210 may have a structure in which the first polyimide layer, the barrier film layer, and the second polyimide layer are stacked on a glass substrate. For example, after an insulation layer is provided on the second polyimide layer, upper structures including the light emitting structure 230 may be disposed on the insulation layer. After the upper structures are formed on the insulation layer, the glass substrate may be removed. That is, since it may be difficult to form the upper structures directly on the polyimide substrate, which is thin and flexible, the upper structures may be formed on a rigid glass substrate, and then the polyimide substrate may be used as the first substrate 210 after removal of the rigid glass substrate.

The switching element (not illustrated) of the light emitting structure 230 may be disposed in the display region DR of the first substrate 210. In example embodiments, the switching element may be a semiconductor device which may include an active layer containing oxide semiconductor, inorganic semiconductor (e.g., amorphous silicon, polysilicon, etc.), organic semiconductor, etc.

The switching element may be electrically connected to the anode (not illustrated). The anode may be disposed on the switching element, and the cathode (not illustrated) may be located on the anode. Each of the anode and the cathode may include metal, metal alloy, metal nitride, conductive metal oxide, a transparent conductive material, etc. For example, the anode and the cathode may include aluminum (Al), aluminum alloy, aluminum nitride ($AlN_x$), silver (Ag), silver alloy, tungsten (W), tungsten nitride ($WN_x$), copper (Cu), copper alloy, nickel (Ni), chromium (Cr), chromium nitride ($CrN_x$), molybdenum (Mo), molybdenum alloy, titanium (Ti), titanium nitride ($TiN_x$), platinum (Pt), tantalum (Ta), tantalum nitride ($TaN_x$), neodymium (Nd), scandium (Sc), strontium ruthenium oxide (SRO), zinc oxide ($ZnO_x$), indium tin oxide (ITO), tin oxide ($SnO_x$), indium oxide ($InO_x$), gallium oxide ($GaO_x$), indium zinc oxide (IZO), etc. These may be used alone or in a combination thereof.

In the light emitting structure 230 according to example embodiments, the light emitting layer may be positioned between the anode and the cathode. For example, the light emitting layer may have a multilayer structure including an organic light emitting layer (EL), a hole injection layer (HIL), a hole transfer layer (HTL), an electron transfer layer (ETL), an electron injection layer (EIL), etc. In example embodiments, the organic light emitting layer may include light emitting materials capable of generating different colors of light such as a red color of light, a blue color of light, and a green color of light in accordance with types of pixels of the display device. In some example embodiments, the organic light emitting layer may generally generate a white color of light by stacking a plurality of light emitting materials capable of generating different colors of light such as a red color of light, a green color of light, a blue color of light, etc. The cathode may be located on the light emitting layer.

As illustrated in FIG. 1, the sealant 270 may be disposed in the peripheral region PR of the first substrate 210, e.g., the sealant 270 may surround the display region DR. In example embodiments, the sealant 270 may include frit and the like.

In a conventional display device, a conventional sealant may be disposed on a lower substrate, and may have a constant width. When the conventional display device is used, the conventional display device may be dropped by carelessness of a user, or may be impacted by an external force. In this case, a portion of the conventional sealant adjacent to a function button of the conventional display device may be easily damaged. As a result, a cover, e.g., an upper frame and/or a lower frame of the conventional display device, may be detached from the lower substrate, e.g., may be broken, and elements disposed on the lower substrate may be degraded.

Therefore, as illustrated in FIGS. 2-3, the sealant 270 according to example embodiments may include a non-uniform width. That is, the sealant 270 may include a first portion 270a having a relatively large first width SW1, and a second portion 270b having a relatively small second width SW2, i.e., the second width SW2 may be smaller than the first width SW1. For example, as illustrated in FIG. 2, two opposite sides of the first portion 270a are expanded, e.g., stretched away from each other symmetrically, along the x-axis relative to the second portion 270b.

In this case, the first portion 270a of the sealant 270 may have a structure, e.g., a shape, with two sides that are substantially enlarged, e.g., expanded away from each other along the x-axis. For example, the first portion 270a of the sealant 270 may have a substantial elliptical plan shape, a substantial track plan shape, a substantial rectangular plan shape, etc. On the other hand, the second portion 270b of the sealant 270 may have a structure, e.g., a shape, with a substantially uniform second width SW2. For example, the second portion of the sealant 270 may have a line shape, a bar shape, etc. The first portion 270a of the sealant 270 may be positioned at a first portion ESR of the first substrate 210, and the second portion 270b of the sealant 270 may be disposed at a second portion SR of the first substrate 210.

In example embodiments, the first portion 270a of the sealant 270 may have a maximum width and a minimum width, e.g., width along the x-axis in FIG. 2. In this case, the maximum width of the first portion 270a may be defined as the first width SW1. The minimum width of the first portion of the sealant 270 may be substantially the same as the second width SW2 of the second portion of the sealant 270. For example, the first portion 270a may have a maximum width, i.e., the first width SW1, along the x-axis that gradually decreases along the y-axis to reach the minimum width, i.e., the second width SW2, at the boundary between the first and second portions 270a and 270b, i.e., boundary between the first and second portions ESR and SR. For example, when the first portion 270a of the sealant 270 has a substantially elliptical shape or a substantially track shape, the boundary between the first portion 270a and the second portion 270b may have the second width SW2, and the first portion ESR may have the first width SW1.

In example embodiments, a plurality of function buttons of the display device may be disposed adjacent to the first portion ESR of the first substrate 210. For example, the first portion ESR of the first substrate 210 may be adjacent to, e.g., a power on/off button, an output control button, a volume control button, a mute button, etc. Each of the function buttons may include a button cover which user's finger or the like contacts, and a pressure transmitting member combined with the button cover. The function button may be generally combined with an elastic member and a dome switch inside of the display device. When the button cover is pressed by the user's finger or a pen, a predetermined pressure may be transmitted to the elastic member via the pressure transmitting member. For example, the elastic member may include elastomer, e.g., rubber. After the predetermined pressure is applied to the dome switch via the elastic member, the function button may be returned from a pressurized state to a released state by an elastic force of the elastic member. When the predetermined pressure is transmitted to the dome switch via the elastic member, the dome switch may generate an input signal, and then a control unit of the display device may indicate an operation of the function button in response to the input signal.

According to example embodiments, when the display device includes a plurality of function buttons arranged at a lateral portion thereof, the sealant 270 may include a plurality of first portions 270a disposed adjacent to the function buttons, respectively. For example, as illustrated in FIG. 2, a portion of the sealant 270 adjacent to a function button 130a may have a relatively large first width SW1. In some example embodiments, when the display device includes additional function buttons disposed at an upper portion and/or a lower portion of the display device, portions of the sealant 270 adjacent to the additional function buttons may have the relatively large first widths SW1, respectively.

A plurality of wirings, e.g., power lines, data lines, scan lines, etc., may be disposed between the sealant 270 and the light emitting structure 230. Here, the first portion 270a of the sealant 270 having the first width SW1 may extend such that the first portion 270a of the sealant 270 may not overlap with the wirings. In a process for separating, e.g., cutting, an individual display device from a mother substrate for manufacturing a plurality of display devices, the display devices may be generally separated by a wheel cutting. The first portion 270a of the sealant 270 may extend such that the first portion 270a of the sealant 270 may not overlap with a minimum region of the display device required for the wheel cutting.

According to example embodiments, the first portion 270a of the sealant 270 adjacent to at least one function button of the display device may have the enlarged first width SW1, so that damage to the display device or a malfunction of the display device may be effectively prevented while minimizing a decrease of the display region DR of the display device.

Referring again to FIG. 1, the second substrate 250 may be disposed on the light emitting structure 230 and the sealant 270. The second substrate 250 may include a transparent insulation material, a flexible material, etc. For example, the second substrate 250 may include a glass substrate, a quartz substrate, a transparent resin substrate, etc. In another example, the second substrate 250 may have a configuration in which at least one organic layer and at least one inorganic layer may be alternately stacked. In this case, the inorganic layer may include, e.g., silicon oxide, silicon nitride, silicon oxynitride, silicon oxycarbide, silicon carbonitride, aluminum oxide, aluminum nitride, titanium oxide, zinc oxide, etc. Additionally, the organic layer may include, e.g., acrylate monomer, phenylacetylene, diamine, dianhydride, siloxane, silane, parylene, olefin-based polymer, polyethylene terephthalate, fluorine resin, polysiloxane, etc.

To combine the first substrate 210 with the second substrate 250, a laser may be irradiated onto the sealant 270 positioned in the peripheral region PR. In the laser irradiation, a phase of the sealant 270 may be changed from a solid phase to a liquid phase, and then the sealant 270 in the liquid phase may be cured into the solid phase after a predetermined time. In accordance with the phase change of the sealant 270, the second substrate 250 may be combined with the first substrate 210 to seal the second substrate 250 relative to the first substrate 210. With a seal combination between the first and second substrates 210 and 250, degradation of the light emitting structure 230 caused by permeation of moisture and/or oxygen may be prevented.

In a laser irradiation process according to example embodiments, when the laser is irradiated onto the sealant 270 including the first portion and the second portion, an adhesion force, i.e., an adhesion force between the first substrate 210 and the second substrate 250, of the first portion having the relatively large first width SW1 may be greater than that of the second portion having the relatively small second width SW2. In other words, the increased width of the first width SW1 relative to the second width SW2 increases an overall overlap area between the first portion 270a of the sealant 270 and each of the first and second substrates 210 and 250, thereby increasing the adhesion force between the first and second substrates 210 and 250 in the region of the first portion 270a with the first width SW1. Accordingly, portions of the first and second substrates 210 and 250 attached to each other by the first portion 270a of the sealant 270, i.e., portions adjacent to the function buttons, have a higher, e.g., stronger, adhesion therebetween, as compared to other portions of the first and second substrates 210 and 250 attached to each other, e.g., attached to each other by the second portion 270b of the sealant 270.

In addition, a total adhesion force between the first substrate 210 and the second substrate 250 may be increased by the first portion of the sealant 270. Therefore, even when the display device falls down or an external impact is applied thereto, portions of the first and second substrates 210 and 250 adjacent to the function buttons may be strongly combined, i.e., adhered to each other, by the first portion 270a of the sealant 270. Thus, the second substrate 250 may not be detached from the first substrate 210. Additionally, degradation of components of the display device may be prevented or substantially minimized.

Figure 4:
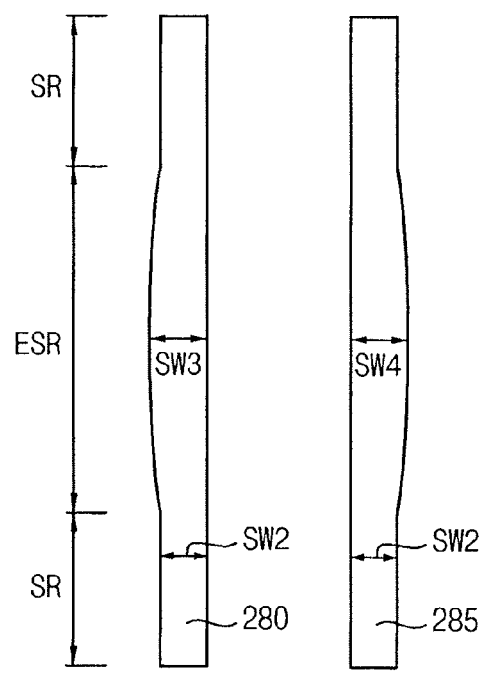
FIG. 4 illustrates a plan view of a sealant of a display panel in accordance with other example embodiments.

FIG. 4 is a plan view of a sealant of a display panel in accordance with other example embodiments. In FIG. 4, sealants 280 and 285 having various shapes are illustrated, but configurations of the sealants 280 and 285 may vary according to shapes of function buttons of the display device, positions of the function buttons, and/or a configuration of the display device.

Referring to FIG. 4, a display device according to another example embodiment may include the sealant 280, of which a first portion may have only one enlarged side adjacent to the function buttons along a first direction, e.g., opposite sides of the sealant 280 may be stretched away from each other asymmetrically along the x-axis relative to the second portion. For example, the display device may include the sealant 280 including a first portion having a relatively large third width SW3 at the first portion ESR of the first substrate, such that the sealant 280 may not overlap with a minimum region required for a wheel cutting. In this case, a second portion of the sealant 280 at the second portion SR of the first substrate may have a relatively small second width SW2. For example, the first portion of the sealant 280 may have a substantially semicircular plan shape, a substantially arch plan shape, etc.

As illustrated in FIG. 4, a display device according to still another example embodiment may include the sealant 285, of which a first portion may have an enlarged side adjacent to the function button along a second direction. Here, the second direction may be opposite to the first direction. For example, the first portion of the sealant 285 at the first portion ESR may have a substantially arch plan shape, a substantially semicircular plan shape, etc. The first portion of the sealant 285 may have a relatively large fourth width SW4 such that the first portion of the sealant 285 and wirings disposed between the sealant 285 and a light emitting structure (not illustrated) may not overlap. In addition, a second portion of the sealant 285 at the second portion SR may have a relatively small second width SW2.

Figure 5:
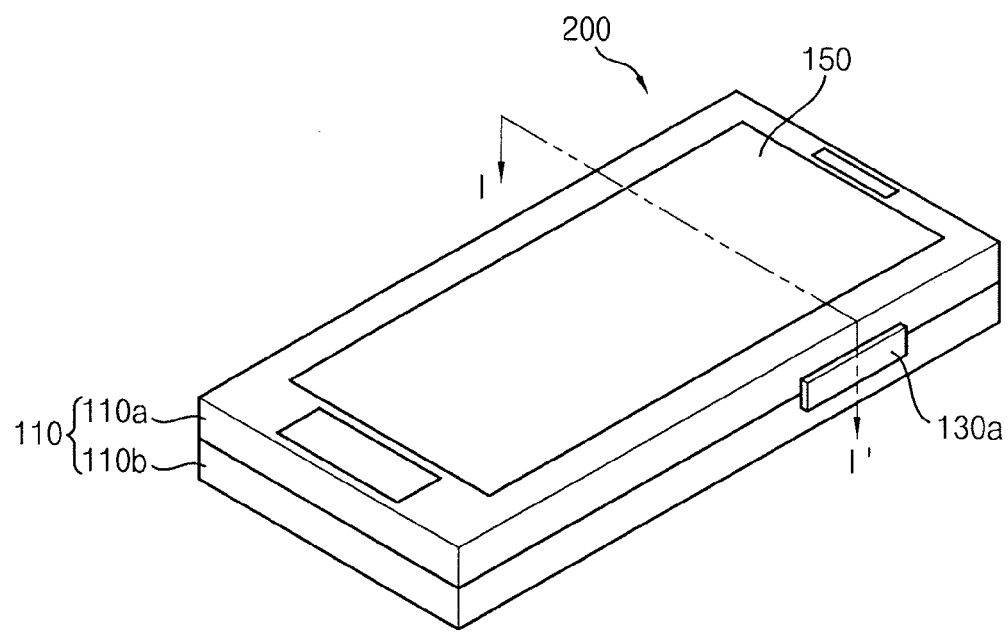
FIG. 5 illustrates a perspective view of a display device in accordance with example embodiments.
Figure 6:
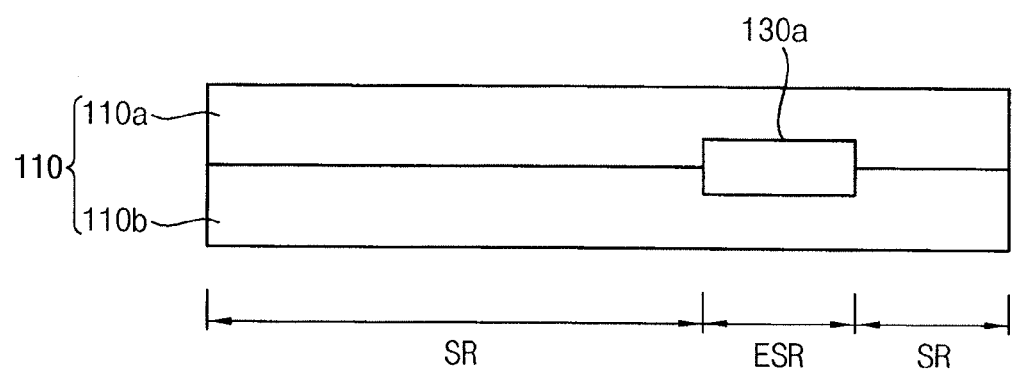
FIG. 6 illustrates a side view of a display device in accordance with example embodiments.
Figure 7:
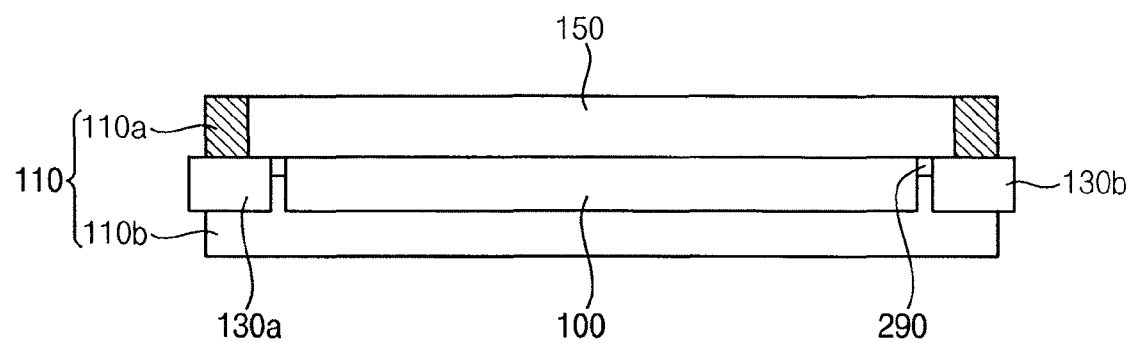
FIG. 7 illustrates a cross-sectional view of the display device along line I-I' in FIG. 5.

FIG. 5 is a perspective view of a display device in accordance with example embodiments. FIG. 6 is a side view of a display device in accordance with example embodiments. FIG. 7 is a cross-sectional view illustrating the display device taken along a line I-I' in FIG. 5. It is noted that the display panel 100 illustrated in FIG. 7 has a substantially same configuration as that of the display panel described with reference to FIG. 1. Therefore, detailed descriptions of same elements will be omitted.

Referring to FIGS. 5 to 7, a display device 200 may include a body 110, function buttons 130a and 130b, a window 150, the display panel 100, a sealing member 290, etc. Here, the body 110 may include an upper frame 110a and a lower frame 110b.

The window 150 may be disposed on the display panel 100. For example, the window 150 may correspond to, e.g., overlap, the display region DR of the display panel 100. For example, the window 150 may include a tempered glass. In some example embodiments, a touch screen panel (not illustrated) may be additionally disposed between the display panel 100 and the window 150. The touch screen panel may include a lower polyethylene terephthalate (PET) film, touch screen panel electrodes, an upper PET film, etc. Each of the lower and upper PET films may protect the touch screen panel electrodes. The touch screen panel electrodes may entirely have a metal mesh structure. For example, the touch screen panel electrodes may include carbon nano tube (CNT), transparent conductive oxide (TCO), indium tin oxide (ITO), indium gallium zinc oxide (IGZO), zinc oxide (ZnO), graphene, silver nanowire (AgNW), copper (Cu), chrome (Cr), etc.

The window 150 and the display panel 100 may be enclosed by the upper and the lower frames 110a and 110b of the body 110. The upper frame 110a and the lower frame 110b may protect the window 150 and the display panel 100. For example, the body 110 may include synthetic resin or metal, e.g., stainless steel, titanium, etc.

As illustrated in FIGS. 5 to 7, both sides of the body 110 may include at least one opening, respectively. In example embodiments, the function buttons 130a and 130b may be disposed in the openings, respectively. Each of the function buttons 130a and 130b may partially protrude out of the body 110. Here, a portion of the display device 200 adjacent to the function buttons 130a and 130b, e.g., a portion at which the openings are positioned, may be defined as the first portion ESR of the display device 200. In addition, a portion without the function buttons 130a and 130b may be defined as the second portion SR of the display device 200. In some example embodiments, at least one opening may be provided in each of the two lateral sides, an upper portion, and/or a lower portion of the body 110, respectively. Accordingly, the display device 200 may have a plurality of first portions ESR and a plurality of openings, such that the number of the first portions ESR is the same as the number of the openings.

As described above, the function buttons 130a and 130b may be positioned in the first portion ESR. The display device 200 may perform various operations according to a user's manipulation of the function buttons 130a and 130b. For example, the user may push the function buttons 130a and 130b to start or terminate operations of the display device 200, to control a volume, etc. In example embodiments, each of the function buttons 130a and 130b may include a button cover (not illustrated) which a user's finger contacts, a pressure transmitting member (not illustrated) combined with the button cover, etc. Each of the function buttons 130a and 130b may be combined with an elastic member (not illustrated) and a dome switch (not illustrated) disposed inside of the display device 200. For example, the elastic member may include rubber and the like.

When the function buttons 130a and 130b are pressed by the user, a predetermined pressure may be applied to the elastic member through the pressure transmitting member. After the pressure is transmitted to the dome switch via the elastic member, the function buttons 130a and 130b may be changed from a pressurized state to a released state by an elastic force of the elastic member. When the predetermined pressure is applied to the dome switch, the dome switch may generate an input signal, and then a control unit (not illustrated) of the display device 200 may indicate operations of the function buttons 130a and 130b in response to the input signal. In some example embodiments, the display device 200 may include a touch sensor instead of the function buttons 130a and 130b such that the display device 200 may be operated by a touch of the user.

In example embodiments, as illustrated in FIGS. 2-4, the sealant may be disposed at the first portion ESR of the display device 200 where the function buttons 130a and 130b are located. The sealant may be either one of sealants 270, 280 or 285 with the first portion, of which at least one side has an enlarged width.

When the display device 200 is used, the body 110 may absorb an impact to the display device 200 even when the display device 200 is dropped or an external impact is applied thereto. However, if the display device 200 is exposed to an excessive impact beyond an endurance of the body 110, the display panel 100 may be damaged or broken. In this case, a portion of the body 110 adjacent to an opening, i.e., an opening in the body for a function button, may be more easily damaged than other portions of the body 110, e.g., along a contact region between the upper frame 110a and the lower frame 110b. For example, the conventional sealant between the first and second substrates of the display panel 100 may be damaged or broken by the applied impact, and thus the first substrate may be detached from the second substrates. Additionally, functions of components of the display device may be degraded.

Therefore, according to example embodiments, a width of the sealant at the first portion ESR of the display device 200, i.e., a region adjacent to the opening, may be formed to be substantially larger than other portions of the sealant at the second portion SR of the display device 200. In example embodiments, the first portion of the sealant positioned at the first portion ESR may have the relatively large first width SW1, and the second portion of the sealant positioned at the second portion SR may have the relatively small second width SW2. For example, the first portion of the sealant may have a substantially elliptical plan shape, a substantially track plan shape, a substantially rectangular plan shape, etc. In addition, the second portion of the sealant may have a substantial line shape, a substantial bar shape, etc.

As illustrated in FIG. 7, the sealing member 290 may be disposed between the function buttons 130a and 130b and the display panel 100. The sealing member 290 may block water and/or moisture, from permeating into the inside of the display device 200. For example, the sealing member 290 may include urethane, epoxy, etc. These may be used alone or in a combination thereof.

As described above, the sealant having the enlarged first width SW1 may be located at the first portion ESR of the display device 200 adjacent to the function buttons 130a and 130b. Accordingly, detachment between the first and the second substrates of the display panel 100 by dropping the display device 200 or by an external impact may be prevented, and also degradation of the components of the display device 200 may be suppressed.

FIGS. 8A to 8J are cross-sectional views of stages in a method of manufacturing a display device in accordance with example embodiments.

Figure 8A:
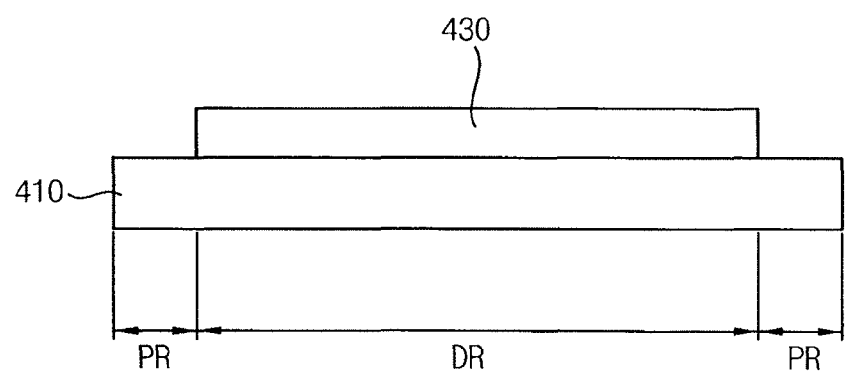
FIGS. 8A to 8J illustrate cross-sectional views of stages in a method of manufacturing a display device in accordance with example embodiments.

Referring to FIG. 8A, a first substrate 410 having the display region DR and the peripheral region PR may be provided. A switching element including an oxide semiconductor or a thin film transistor may be formed in the display region DR of the first substrate 410. For example, the first substrate 410 may be formed using a transparent inorganic material or flexible plastic.

A light emitting structure 430 may be formed in the display region DR of the first substrate 410. The light emitting structure 430 may be electrically connected to the switching element. The light emitting structure 430 may include an anode, a light emitting layer, a cathode, etc. The anode may be electrically connected to the switching element. For example, the anode may be formed using metal, metal alloy, metal nitride, conductive metal oxide, a transparent conductive material, etc. The light emitting layer may be formed on the anode. The light emitting layer may have a multilayer structure including an EL, an HIL, an HTL, an ETL, an EIL, etc. The EL of the light emitting layer may include light emitting materials for generating different colors of light such as a red color of light, a blue color of light and a green color of light in accordance with types of pixels. In some example embodiments, the EL may generally generate a white color of light by stacking a plurality of light emitting materials for generating different colors of light such as a red color of light, a green color of light, a blue color of light, etc. The cathode may be formed on the light emitting layer. For example, the cathode electrode may be formed using metal, metal alloy, metal nitride, conductive metal oxide, a transparent conductive material, etc.

Figure 8B:
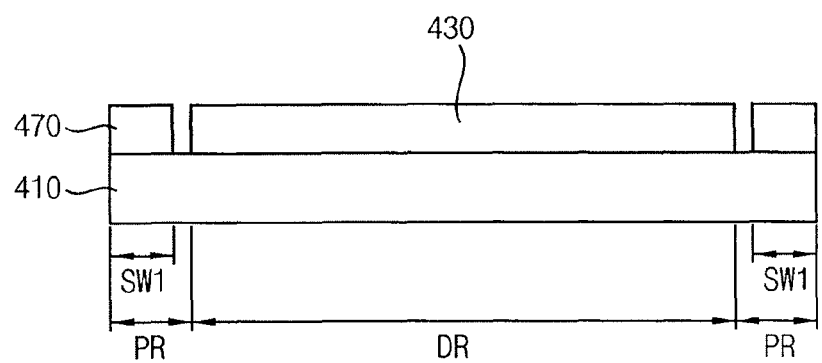

Referring to FIG. 8B, a sealant 470 may be formed in the peripheral region PR of the first substrate 410. In example embodiments, the sealant 470 may be formed using frit and the like. The sealant 470 may be identical to any of the sealants 270, 280, and 285 described previously.

Figure 8C:
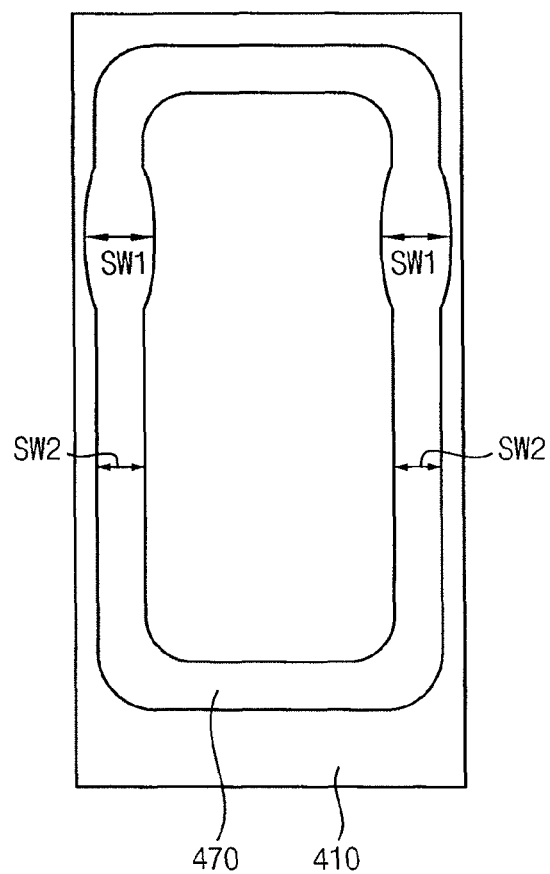
Figure 8D:
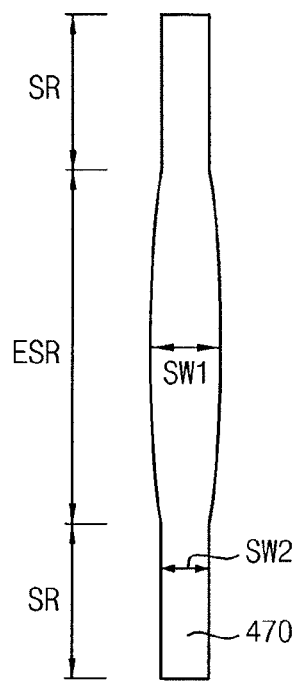

In detail, referring to FIGS. 8C and 8D, the sealant 470 may include a first portion and a second portion. The first portion of the sealant 470 may have a relatively large first width SW1, and the second portion of the sealant 470 may have a relatively small second width SW2. The first portion of the sealant 470 may be formed in a first portion ESR of the display device (or a display panel). The second portion of the sealant 470 may be formed in a second portion SR of the display device (or the display panel). As described above, the first portion of the sealant 470 having the first width SW1 may include at least one enlarged side (i.e., at least one side having an enlarged width). For example, the first portion of the sealant 470 may have a substantially elliptical plan shape, a substantially track plan shape, a substantially rectangular plan shape, etc. The second portion of the sealant 470 may have a substantial line shape, a substantial bar shape, etc. In example embodiments, the sealant 470 may have the relatively small second width SW2 at a boundary between the first and second portions ESR and SR of the display device. The sealant 470 may have the first width SW1 (e.g., a substantially maximum width) at a center of the first portion ESR.

The first portion of the sealant 470 may be formed at the first portion ESR of the display device where function buttons such as a power on/off button, an output control button, a volume control button and/or a mute button may be disposed. That is, the first portion of the sealant 470 may be formed adjacent to the function buttons at the first portion ESR of the display device. When the display device has two function buttons, the display device may include the sealant 470, for example, having two first portions. Meanwhile, when the display device has one or more than three function buttons, the display device may include the sealant 470 having a plurality of first portions of which number is the same as the number of the function buttons.

In example embodiments, a plurality of wirings (e.g., power lines, data lines, scan lines, etc.) may be formed between the sealant 470 and the light emitting structure 430. In this case, the first portion of the sealant 470 having the first width SW1 may be enlarged such that the first portion of the sealant 470 and the wirings may not be substantially overlapped. In a process (e.g., cutting) for separating an individual display device from a mother substrate, the display devices may be usually divided into respective display devices by a wheel cutting. The first portion of the sealant 470 may be enlarged so that the first portion of the sealant 470 may not be overlapped with a minimum region required for the wheel cutting.

Figure 8E:
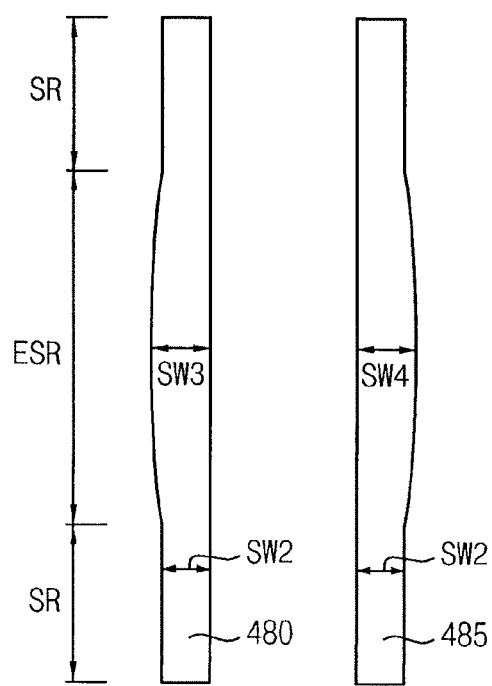

In some example embodiments, as illustrated in FIG. 8E, the display device may include sealants 480 and 485 having first portions of which at least one side may be enlarged. For example, each of the first portions of the sealants 480 and 485 may have a substantially semicircular plan shape, a substantially arch plan shape, etc. Additionally, the display device may include the sealant 480 having a first portion of a relatively large third width SW3 such that the first portion of the sealant 480 and a minimum region required for the wheel cutting may not be overlapped. Meanwhile, the display device may include the sealant 485 having a first portion of a relatively large fourth width SW4 such that the first portion of the sealant 285 and the wirings disposed between the sealant 485 and the light emitting structure 430 may not be substantially overlapped.

Figure 8F:
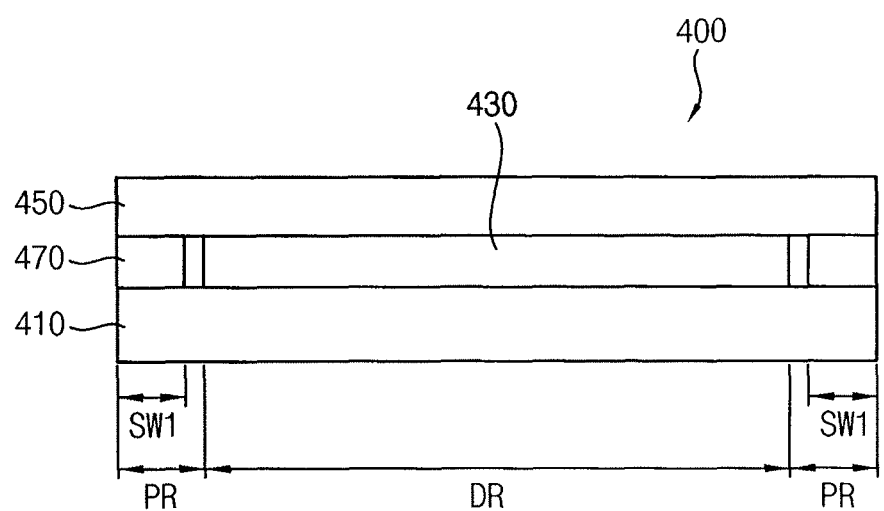

Referring to FIG. 8F, a second substrate 450 may be formed on the sealant 470 and the light emitting structure 430. Accordingly, a display panel 400 including the first substrate 410, the light emitting structure 430, the sealant 470, and the second substrate 250 may be provided. The second substrate 450 may be formed using a transparent insulation material, a flexible material, etc. For example, the second substrate 450 may include a glass substrate, a quartz substrate, a transparent resin substrate, etc. In another example, the second substrate 450 may have a configuration in which at least one organic layer and at least one inorganic layer may be alternately stacked. For example, the inorganic layer may be formed using, e.g., silicon oxide, silicon nitride, silicon oxynitride, silicon oxycarbide, silicon carbonitride, aluminum oxide, aluminum nitride, titanium oxide, zinc oxide, etc. Additionally, the organic layer may be formed using, e.g., acrylate monomer, phenylacetylene, diamine, dianhydride, siloxane, silane, parylene, olefin-based polymer, polyethylene terephthalate, fluorine resin, polysiloxane, etc.

To combine the first substrate 410 with the second substrate 450, a laser may be irradiated into the peripheral region PR. During a laser irradiation process, a phase of the sealant 470 may be changed from a solid phase to a liquid phase. Then, the sealant 470 having the liquid phase may be cured so that the sealant 470 may have the solid phase again after a predetermined time. In accordance with the phase change of the sealant 470, the second substrate 450 may be combined with the first substrate 410 to thereby seal the second substrate 450 and the first substrate 410. In example embodiments, an adhesion force between the first substrate 410 and the second substrate 450 may be increased by the first portion of the sealant 470 having the relatively large first width SW1 positioned in the peripheral region PR. Accordingly, even though the display device may receive an impact due to a drop or an external force during a use of the display device, the second substrate may not be detached from the first substrate because of the sealant 470 including the enlarged first portion formed adjacent to the function buttons. In addition, elements of the display device 400 may not be degraded due to the sealant 470 including the enlarged first portion.

Figure 8G:
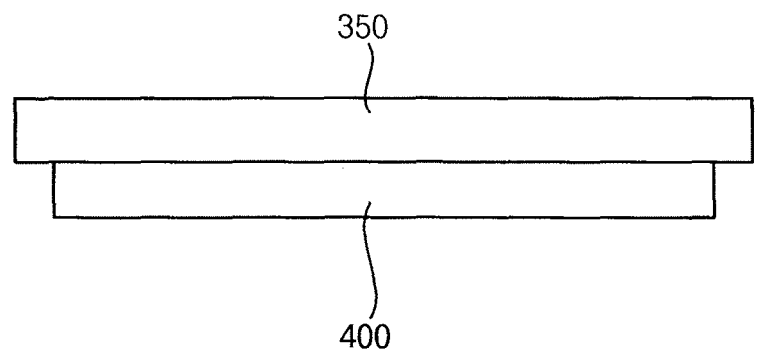

Referring to FIG. 8G, a window 350 may be formed on the display panel 400. For example, the window 150 may be formed using tempered glass. In some example embodiments, a touch screen panel (not illustrated) may be additionally formed between the display panel 400 and the window 350. The touch screen panel may include a lower PET film, touch screen panel electrodes, an upper PET film, etc. Each of the lower PET film and upper top PET film may protect the touch screen panel electrodes. The touch screen panel electrodes may have a metal mesh structure. For example, the touch screen panel electrodes may be formed using CNT, TCO, ITO, IGZO, ZnO, graphene, AgNW, Cu, Cr, etc.

Figure 8H:
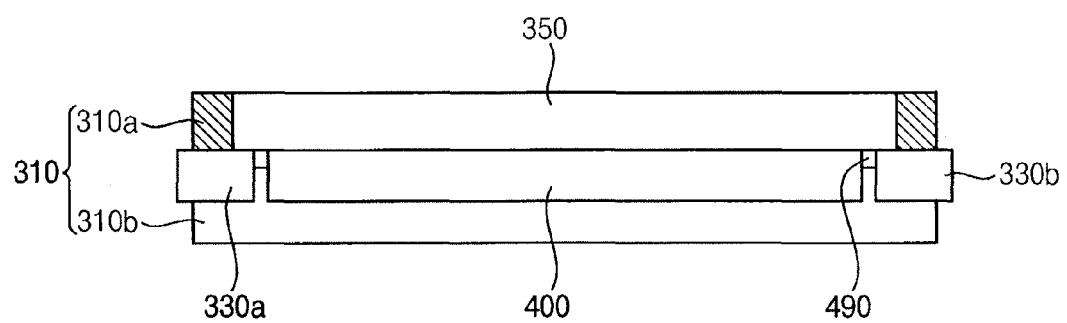
Figure 8I:
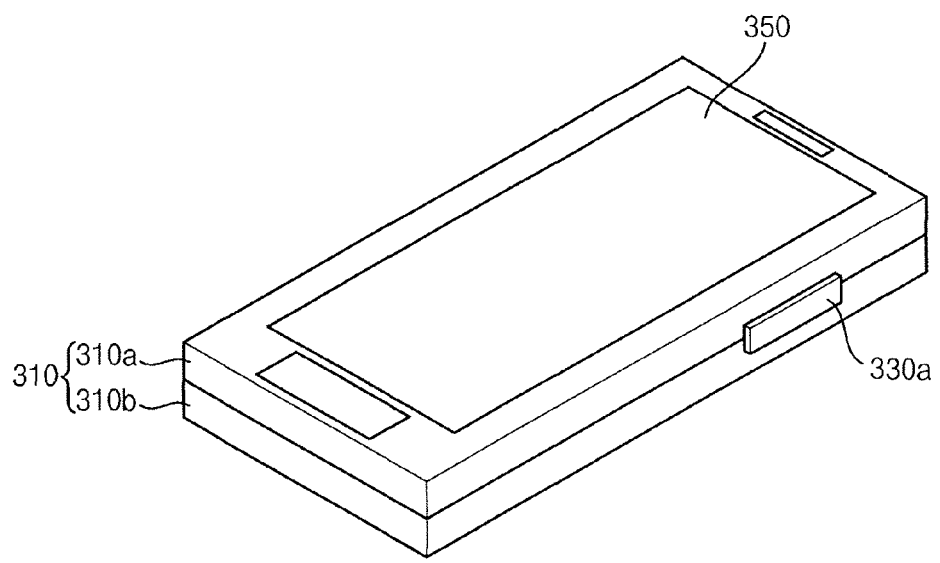
Figure 8J:
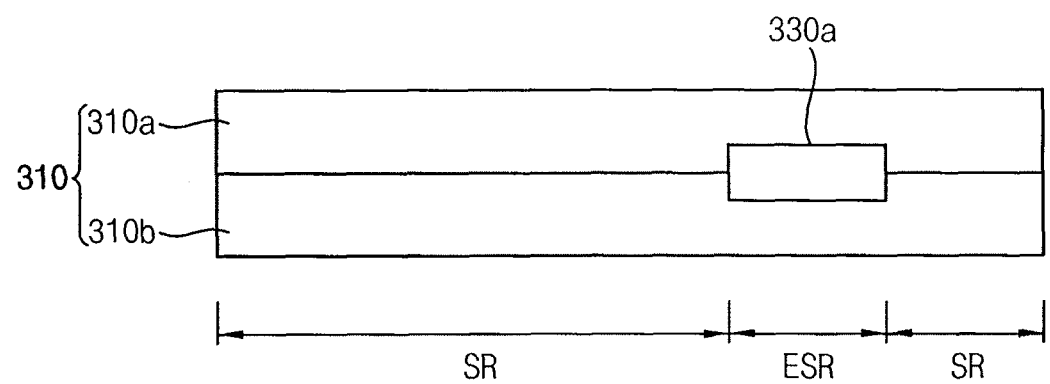

Referring to FIGS. 8H to 8J, the window 350 and the display panel 400 may be received in a body 310 including an upper frame 310a and a lower frame 310b. In this case, at the first portion ESR, function buttons 330a and 330b of the display device may be formed such that at least portions of the function buttons 330a and 330b may be protruded from the body 310. A user may input various commands such as start or end of operations, a control of a volume, etc. through the function buttons 330a and 330b. In example embodiments, when the user pushes the function button 330a (and/or the function button 330b), the function button 330a may be pressed. When a pressurized state of the button 330a is released (e.g., a released state), the function button 330a may be returned to an initial position.

In general, each of the function buttons 330a and 330b may include a button cover (not illustrated) contacting a finger of the user or a pen, and a pressure transmitting member (not illustrated) combined with the button cover. Each of the function buttons 330a and 330b may be combined with an elastic member (not illustrated) and a dome switch (not illustrated) provided in an inside of the display device. When the button cover is pressed by the finger of the user or the pen, a predetermined pressure may be transmitted to the elastic member via the pressure transmitting member. For example, the elastic member may include an elastomer, e.g., rubber. After the predetermined pressure is applied to the dome switch through the elastic member, the function button 330a (and/or the function button 330b) in the pressurized state may be changed to the released state by an elastic force of the elastic member. In case that the predetermined pressure is applied to the dome switch via the elastic member, the dome switch may generate an input signal, and the dome switch may notify the pressurized state of the function button 330a (and/or the function button 330b) to a control unit (not illustrated) of the display device 400. In some example embodiments, the function buttons 330a and 330b may be replaced as a touch sensor. When the display device 400 includes the touch sensor, the display device 400 may be operated by touch of the user or the pen.

A sealing member 490 may be filled between the function buttons 330a and 330b and the display panel 400. The sealing member 490 may block permeation of water and moisture from the outside into the inside of the display device 400. For example, the sealing member 490 may be formed using urethane, epoxy, etc.

The example embodiments may be applied to various display devices including a sealant. For example, the example embodiments may be employed in a mobile phone, a smart phone, a notebook computer, a laptop computer, a tablet computer, a personal digital assistant (PDA), a portable multimedia player (PMP), a digital camera, an audio player (e.g., an MP3 player), a portable game console, a navigation system, etc.

By way of summation and review, an electric device may be damaged by dropping thereof or by applying an external impact thereto during its use. When the electric device receives such an undesired impact, a portion of the electric device adjacent to a function button may be easily damaged or broken. For example, a sealant of a display panel positioned adjacent to the function button may be easily broken by the impact, and thus an upper substrate of the display panel may be detached from a lower substrate of the display panel. Further, degradations of elements in the electric device may be generated due to the broken sealant and/or separated substrates.

In contrast, example embodiments provide display devices including sealants having enlarged portions adjacent to function buttons to prevent damage to the display devices or malfunction of elements therein. That is, example embodiments provide display devices with sealants having enlarged widths in portions adjacent to the function buttons, thereby increasing adhesion between the substrates in regions adjacent, surrounding, the function buttons.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
  a display panel including:
    a first substrate having a display region and a peripheral region surrounding the display region,
    a light emitting structure on the display region of the first substrate,
    a sealant on the peripheral region of the first substrate, the sealant including a first portion having a first width and a second portion having a second width smaller than the first width, and
    a second substrate on the light emitting structure and the sealant;
  a body including an upper frame and a lower frame, the upper frame and the lower frame enclosing the display panel; and
  at least one function button at a first portion of the display device, at least a portion of the function button protruding out of the body, and the first portion of the sealant being disposed adjacent to the at least one function button at the first portion of the display device, wherein
  the first portion and the second portion of the sealant are horizontally adjacent to each other on the peripheral region of the first substrate.

2. The display device as claimed in claim 1, wherein two opposite sides of the first portion of the sealant are stretched away from each relative to respective opposite sides of the adjacent second portion.

3. The display device as claimed in claim 2, wherein the first portion of the sealant has an elliptical plan shape, a track plan shape, or a rectangular plan shape.

4. The display device as claimed in claim 3, wherein the second portion of the sealant has a line shape or a bar shape.

5. The display device as claimed in claim 1, wherein only one side of the first portion of the sealant is stretched away to define the first width relative to respective opposite sides of the adjacent second portion.

6. The display device as claimed in claim 5, wherein the first portion of the sealant has a semicircular plan shape or an arch plan shape.

7. The display device as claimed in claim 6, wherein the second portion of the sealant has a line shape or a bar shape.

8. The display device as claimed in claim 1, further comprising a sealing member disposed between the at least one the function button and the display panel.

9. The display device as claimed in claim 1, further comprising a window disposed on the display panel.

10. The display device as claimed in claim 1, wherein the sealant has a maximum width at a center of the first portion of the sealant.

11. The display device as claimed in claim 1, wherein the first portion of the sealant is formed by enlarging the width of the second portion of the sealant at the first portion of the display device.

12. A method of manufacturing a display device, comprising:
  forming a display panel including:
    a first substrate having a display region and a peripheral region surrounding the display region,
    a light emitting structure on the display region of the first substrate,
    a sealant on the peripheral region of the first substrate, the sealant including a first portion having a first width, and a second portion having a second width smaller than the first width, and
    a second substrate on the light emitting structure and the sealant;
  forming a body including an upper frame and a lower frame, the upper frame and the lower frame enclosing the display panel; and
  forming at least one function button at a first portion of the display device, at least a portion of the function button protruding out of the body, and the first portion of the sealant being disposed adjacent to the at least one function button at the first portion of the display device, wherein
  the first portion and the second portion of the sealant are horizontally adjacent to each other on the peripheral region of the first substrate.

13. The method of manufacturing a display device as claimed in claim 12, wherein two opposite sides of the first portion of the sealant are stretched away from each other relative to respective opposite sides of the adjacent second portion.

14. The method of manufacturing a display device as claimed in claim 13, wherein the first portion of the sealant has an elliptical plan shape, a track plan shape or a rectangular plan shape.

15. The method of manufacturing a display device as claimed in claim 14, wherein the second portion of the sealant has a line shape or a bar shape.

16. The method of manufacturing a display device as claimed in claim 12, wherein the sealant has a maximum width at a center of the first portion of the sealant.

17. The method of manufacturing a display device as claimed in claim 12, wherein only one side of the first portion of the sealant is stretched away to define the first width relative to respective opposite sides of the adjacent second portion.

18. The method of manufacturing a display device as claimed in claim 17, wherein the first portion of the sealant has a semicircular plan shape or an arch plan shape.

19. The method of manufacturing a display device as claimed in claim 18, wherein the second portion of the sealant has a line shape or a bar shape.

20. The method of manufacturing a display device as claimed in claim 17, further comprising forming a sealing member disposed between the at least one the function button and the display panel.

21. The method of manufacturing a display device as claimed in claim 17, further comprising forming a window disposed on the display panel.

* * * * *